United States Patent
Yeh et al.

(10) Patent No.: US 7,883,345 B2
(45) Date of Patent: Feb. 8, 2011

(54) SOCKET ASSEMBLY WITH PICK UP CAP

(75) Inventors: Cheng-Chi Yeh, Tu-cheng (TW); Chia-Wei Fan, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/386,604

(22) Filed: Apr. 20, 2009

(65) Prior Publication Data

US 2010/0029107 A1 Feb. 4, 2010

(30) Foreign Application Priority Data

Jul. 29, 2008 (TW) .............................. 97213403 A

(51) Int. Cl.
*H01R 13/44* (2006.01)
(52) U.S. Cl. ........................ 439/135; 439/941
(58) Field of Classification Search ................. 439/135, 439/941
See application file for complete search history.

(56) References Cited

U.S. PATENT DOCUMENTS

| | | | |
|---|---|---|---|
| 6,478,588 B1 * | 11/2002 | Howell et al. ............... | 439/135 |
| 6,875,022 B2 * | 4/2005 | Ma .............................. | 439/41 |
| 6,905,353 B2 | 6/2005 | Ma et al. | |
| 6,945,799 B2 * | 9/2005 | Huang ........................ | 439/135 |
| 7,367,822 B2 * | 5/2008 | Ma .............................. | 439/135 |
| 2008/0102265 A1 * | 5/2008 | Petervary et al. ......... | 428/312.6 |
| 2008/0146044 A1 * | 6/2008 | Liao ........................... | 439/41 |

* cited by examiner

*Primary Examiner*—Gary F. Paumen
(74) *Attorney, Agent, or Firm*—Andrew C. Cheng; Wei Te Chung; Ming Chieh Chang

(57) ABSTRACT

A socket assembly comprises a socket and a pick up cap attached on the socket. The socket has an insulative housing with sidewalls, and the sidewalls have a plurality of protrusions extending upwardly and formed with end surfaces. The pick up cap comprises a plurality of cutouts with inner side surfaces. The inner side surface of the cutout abuts against corresponding end surface of insulative housing to position the pick up cap on the insulative housing. An interference force created between the cutout and the protrusion extends along an extending direction of corresponding sidewall.

14 Claims, 2 Drawing Sheets

SOCKET ASSEMBLY WITH PICK UP CAP

BACKGROUND OF THE INVENTION

1. Field of the Invention

The present invention relates to a socket assembly, and more particularly, to a socket assembly on which a pick up cap is attached.

2. Description of the Related Art

A conventional socket assembly comprises an insulative housing defining a receiving space in a central thereof for receiving an electronic package therein, a plurality of contacts accommodated in the insulative housing and a pick up cap latched on the insulative housing. The insulative housing has two protrusions extending upwardly and inwardly toward the receiving space from each of four corners thereof. Those two protrusions on each corner of the insulative housing have two inner surfaces vertical to each other which provide a datum surface for the electronic package inserted into the receiving space. The insulative housing further defines a recess on a central part of each of two opposite sidewalls. The pick up cap further has a pair of latching arms extending downwardly and engaging with the recesses of the insulative housing. The pick up cap abuts against the inner surfaces of the protrusions to be positioned on the insulative housing. However, the protrusions of the conventional socket assembly are accurately designed according to the size of the electronic package, so the pick up cap also needs to be dimensioned precisely and exactly.

Hence, it is required to improve the disadvantages of the above socket assembly.

SUMMARY OF THE INVENTION

An object of the invention is to provide a socket assembly having a pick up cap, which can be precisely positioned and expediently assembled to an insulative housing of the socket assembly.

To achieve the above-mentioned object, a socket assembly comprises a socket having an insulative housing with sidewalls and a pick up cap attached to the insulative housing. The sidewall of the socket has a plurality of protrusions extending upwardly and formed with end surfaces. The pick up cap comprises a plurality of cutouts with inner side surfaces, which abuts against corresponding end surface of insulative housing to position the pick up cap on the insulative housing, and corresponding interference force created between the cutout and the protrusion extending along an extending direction of corresponding sidewall.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiments of the present invention.

Figure 1:
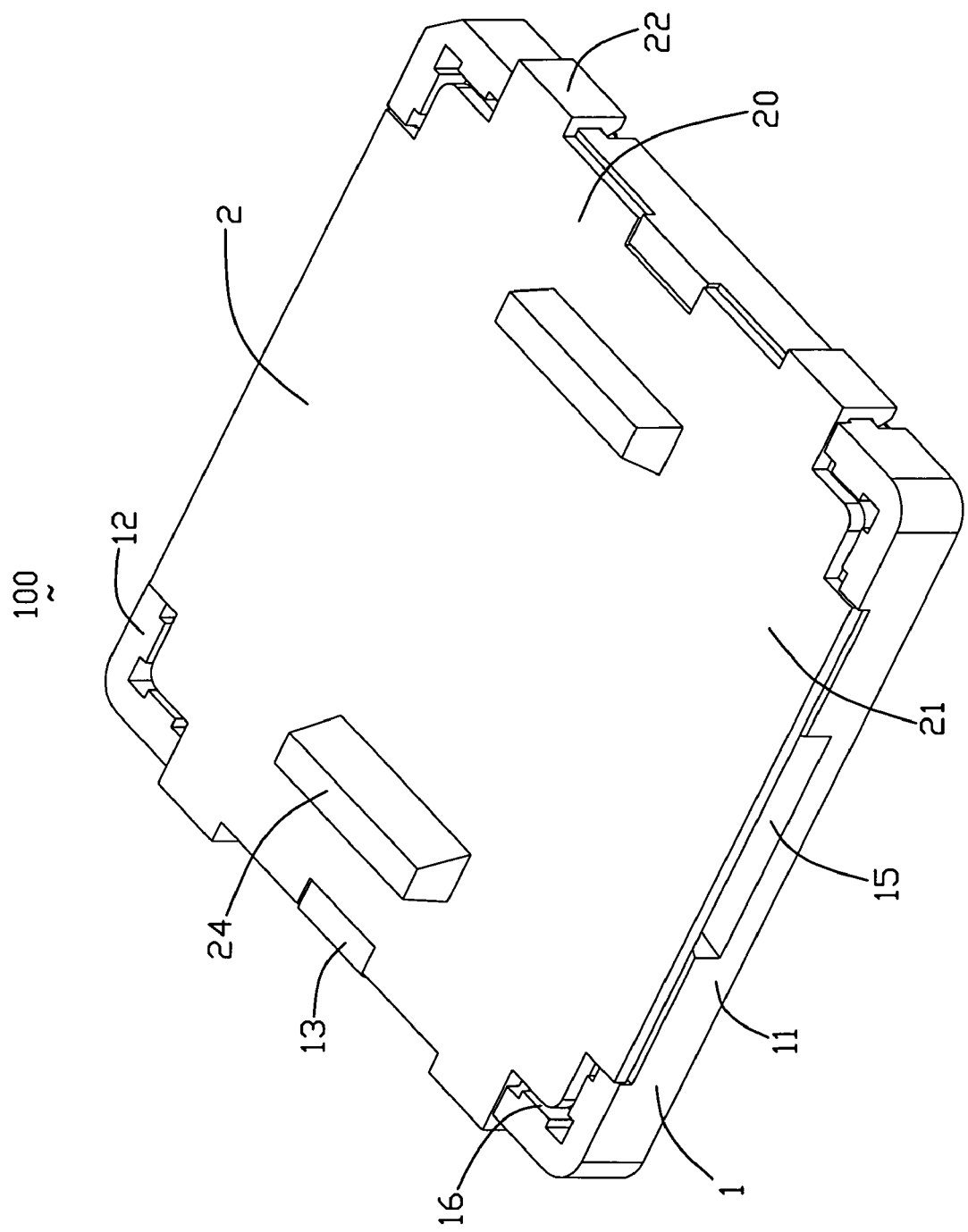
FIG. 1 is an assembled, perspective view of a socket assembly in accordance with a preferred embodiment of present invention.
Figure 2:
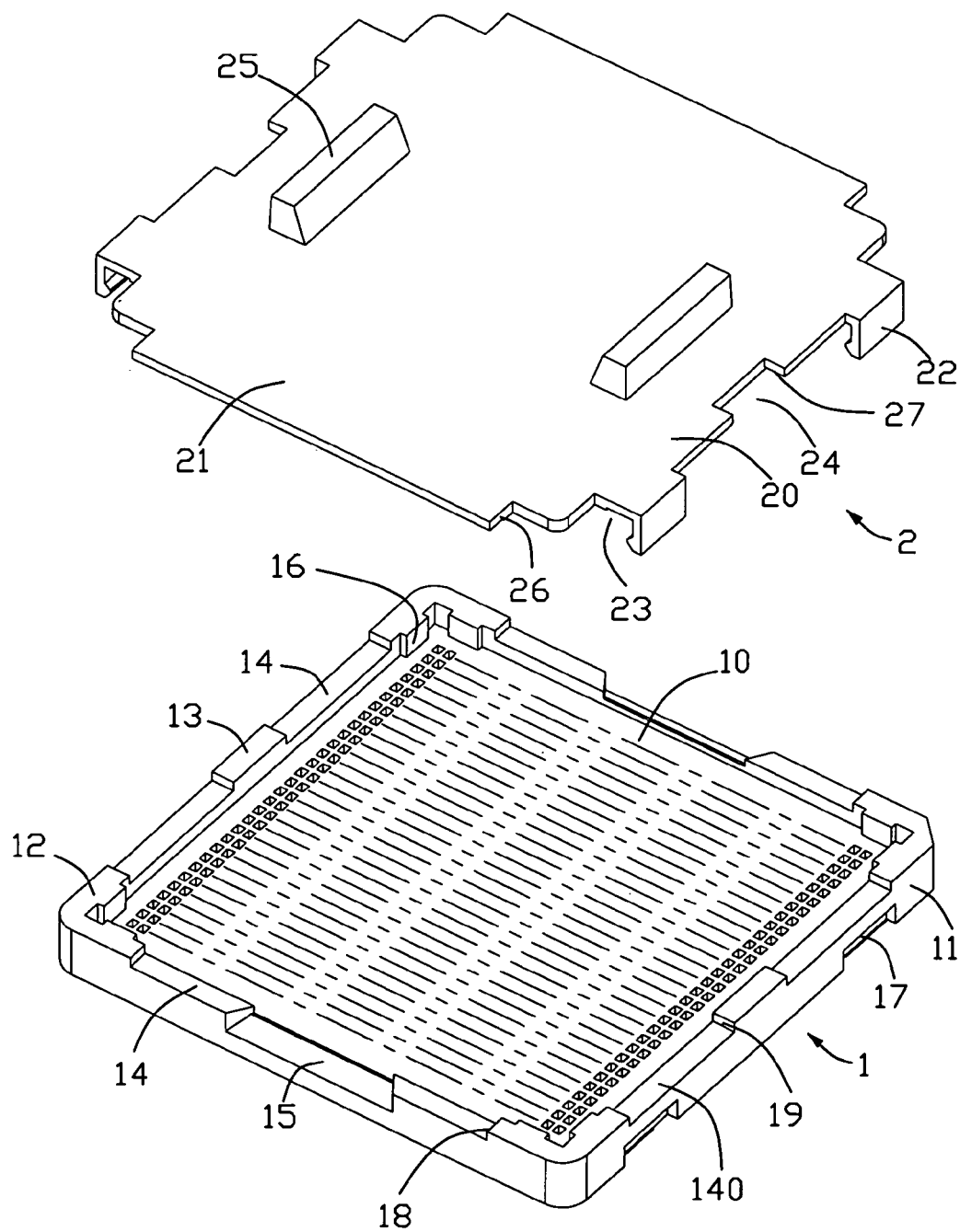
FIG. 2 is an exploded, perspective view of the socket assembly shown in FIG. 1.

Referring to FIGS. 1-2, a socket assembly 100 of the present invention, adapted for electrically connecting an IC package (not shown) to a printed circuit board (not shown), comprises a socket 1 and a pick up cap 2 attached to the socket 1.

The socket 1 comprises an insulative housing 10 and a plurality of contacts (not shown) received in the insulative housing 10. The insulative housing 10 receives a plurality of contacts (not shown). The insulative housing 10 is a rectangular shaped configuration with sidewalls 11 which surround a circumference thereof and have four spaced L-shaped first protrusions 12. The first protrusion 12 projects upwardly from four corners of the insulative housing 10 and is formed with two datum clumps 16 extending inwardly from inner side surfaces thereof. Two second protrusions 13 extend upwardly from middle parts of two opposite sidewalls 11, respectively, and a pair of slot 15 recessed downwardly and disposed on another two opposite sidewalls 11 to be used for operator to easily pick up the IC package received in the socket 1. A plurality of recesses 14 are defined between the protrusions 12 and 13, and bottom surfaces 140 of the recesses 14 of the sidewalls 11 are coplanar to each other so as to define a supporting surface for the pick up cap 2. Each of the sidewall 11 with the second protrusion 13 further defines a pair of latching slots 17 recessed from an outside surface thereof and located beside two sides of the second protrusion 13.

The pick up cap 2 is a rectangular board-like shape, which is attached onto the insulative housing 10 to provide a flat top surface for the socket assembly 100 and to protect the contacts (not shown) of the socket 1. The pick up cap 2 has a pair of first sides 20 and a pair of second sides 21. The pick up cap 2 is formed with a plurality of latching arms 22 extending downwardly from two opposite ends of the first sides 20 to engage with the latching slot 17. The pick up cap 2 defines four spaced L-shaped first cutouts 23 on four corners thereof and two second cutouts 24 on central parts of the first sides 20, respectively. A pair of operating portions 25 are disposed on a top surface thereof for operator to remove the pickup cap 2.

The pick up cap 2 is assembled to the insulative housing 10 by operating the operating portion 25, and is located on and supported by the bottom surfaces 140 of the recesses 14 of the insulative housing 10. Two inner side surfaces 26 of the first cutout 23 abut against the two opposite end surfaces 18 of the L-shaped first protrusions 12; two inner side surfaces 27 of the second cutout 24 abut against the two opposite end surfaces 19 of the second protrusions 13. Since inner end surfaces 18, 19 of the first protrusions 12 and the second protrusions 13, respectively, also are side surfaces of the recesses 14 on the sidewalls 11, so we also can say the pick up cap 2 interferentially engages with the recesses 14 on the sidewalls 11 to position the pick up cap 2 on the socket 1. An interference force created between the cutout 23 or 24 and the protrusion 12 or 13 is along an extending directions of corresponding sidewall. Thus, the pick up cap 2 can be reliably positioned on the insulative housing 10 of the socket 1. Furthermore, the pick up cap 2 will not in contact with the datum clumps 16 of the insulative housing 10. The pick up cap 2 can provide effective protection for the contacts (not shown).

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket assembly comprising:
   a socket having an insulative housing with sidewalls, the sidewall having a plurality of spaced protrusions extending upwardly, the protrusions comprise four L-shaped first protrusions on four corners of the insulative housing and two second protrusions on two opposite sidewalls of the sidewalls, each of the first protrusions and the second protrusions formed with two end surfaces; and
   a pick up cap attached on the insulative housing and comprising a plurality of cutouts, each cutout having two inner side surfaces on two opposite ends thereof, which abuts against corresponding end surface of the protrusion to position the pick up cap on the insulative housing, and an interference force created between the cutout and the protrusion extending along an extending direction of corresponding sidewall.

2. The socket assembly as described in claim 1, wherein the cutouts comprise four L-shaped first cutouts on four corners of the pick up cap and two second cutouts formed on a pair of opposite first sides of the pick up cap, each cutout abuts against two opposite end surfaces of each protrusion.

3. The socket assembly as described in claim 2, wherein the pick up cap has four latching arms extending downwardly from two ends of each first side thereof, respectively, the second cutout is disposed between the two latching arms.

4. The socket assembly as described in claim 2, wherein the pick up cap has a pair of operating portions projecting from a top surface thereof for operator to upwardly lift the pick up cap.

5. The socket assembly as described in claim 2, wherein each first protrusion is formed with a datum clump extending inwardly from an inner side surface thereof, and the pick up cap attached on the socket does not contact the datum clump.

6. A socket assembly comprising:
   a socket having an insulative housing with sidewalls surrounding a circumference thereof, the sidewall formed with a plurality of spaced protrusions and defining a plurality of recesses between the protrusions; and
   a pick up cap interferentially engaged with the opposed side surfaces of the recesses on the sidewalls to position the pick up cap on the insulative housing, wherein the protrusions comprise four L-shaped first protrusions on four corners of the insulative housing and two second protrusions on two opposite sidewalls of the sidewalls.

7. The socket assembly as described in claim 6, wherein bottom surfaces of the recesses support the pick up cap assembled on the socket.

8. The socket assembly as described in claim 6, wherein each of the sidewall with the second protrusion further defines a pair of latching slots recessed from an outside surface thereof and located beside two sides of the second protrusion, the pick up cap is formed with a plurality of latching arms to engage with the latching slots.

9. The socket assembly as described in claim 6, wherein the pick up cap comprises a plurality of cutouts to engage with the protrusions.

10. A socket assembly comprising:
    an insulative housing defining a bottom plate surrounded by four side walls and cooperating with said four side walls to define a receiving cavity;
    at least one of said side walls defining a recess and a slot communicating with said recess in a direction along said one of the side walls;
    a pick up cap positioned upon the housing to cover said receiving cavity; wherein
    said pick up cap defines a protrusion to be received in the recess while leaving said slot recess open so as to allow the receiving cavity to communicate with an exterior therethrough.

11. The socket assembly as claimed in claim 10, wherein said one of the side walls further defines a raised portion beside said recess so as to efficiently align said pick up cap to the housing when downwardly assembling said pick up cap to the housing.

12. The socket assembly as claimed in claim 10, wherein another of said side walls defines another recess, and another protrusion of the pick up cap is received in said another recess.

13. The socket assembly as claimed in claim 12, wherein said another of the side walls further defines another protrusion beside said another recess, and the pick up cap further defines another recess to receive said another protrusion of said another of the side walls.

14. The socket assembly as claimed in claim 12, wherein a latch slot is formed in said another of the side walls, and the pick up cap defines a deflectable latching arm extending outwardly and downwardly from said another protrusion of the pick up cap to be engaged within the latch slot.

\* \* \* \* \*